United States Patent [19]

Fujimura et al.

[11] Patent Number: 5,420,418
[45] Date of Patent: * May 30, 1995

[54] SEMICONDUCTOR LIGHT DETECTION DEVICE HAVING SECONDARY REGION TO CAPTURE AND EXTINGUISH UNNECESSARY CHARGES

[75] Inventors: Yasushi Fujimura; Ichiro Tonai, both of Yokohama, Japan

[73] Assignee: Sumitomo Electric Industries, Ltd., Japan

[*] Notice: The portion of the term of this patent subsequent to Jul. 26, 2011 has been disclaimed.

[21] Appl. No.: 238,784

[22] Filed: May 6, 1994

Related U.S. Application Data

[63] Continuation of Ser. No. 964,828, Oct. 22, 1992, abandoned.

[30] Foreign Application Priority Data

Oct. 25, 1991 [JP] Japan .................. 3-279904

[51] Int. Cl.[6] .................. H01J 40/14; H01J 27/14
[52] U.S. Cl. .................. 250/214.1; 257/461; 257/626
[58] Field of Search .................. 250/214.1, 434, 443, 250/461, 465; 257/623, 626, 653

[56] References Cited

U.S. PATENT DOCUMENTS 4,906,583  3/1990  Kagawa et al. .................. 257/623
4,949,144  8/1990  Kuroda et al. .................. 257/76
5,332,919  7/1994  Fujimura .................. 257/461

FOREIGN PATENT DOCUMENTS 0186460   7/1986  European Pat. Off. .
0216572   4/1987  European Pat. Off. .
0473197   3/1992  European Pat. Off. .
61-289677 12/1986 Japan .

Primary Examiner—Stephone B. Allen
Attorney, Agent, or Firm—Beveridge, DeGrandi, Weilacher & Young

[57] ABSTRACT

This invention relates to a light detecting device comprising a first conduction-type semiconductor substrate, a first conduction-type semiconductor crystal layer formed on the surface of the substrate, and a second conduction-type first region formed in the semiconductor crystal layer. The first region is surrounded by a second conduction-type second region. On the surface of the semiconductor crystal layer, an electrode is formed on the first region, and a reflection preventing layer is formed on that part of the first region inside the electrode, and a device protecting film is formed on that part of the first region outside the electrode. On the semiconductor crystal layer, a metal film is formed in contact both with the semiconductor crystal layer and with the second region. This structure enables the second region to capture unnecessary charges and further to recombine and extinguish them.

28 Claims, 4 Drawing Sheets

SEMICONDUCTOR LIGHT DETECTION DEVICE HAVING SECONDARY REGION TO CAPTURE AND EXTINGUISH UNNECESSARY CHARGES

This application is a continuation application of abandoned application No. 07/964,828, filed Oct. 22, 1992, which application is entirely incorporated herein by reference.

BACKGROUND OF THE INVENTION

1. Field of the Invention

This invention relates to a light detecting device for use in light output monitoring devices of semiconductor lasers, receiving devices of optical communication systems, 2. Prior Art FIG. 1A is a top view of a structure of a conventional light detecting device, and FIG. 1B is a sectional view along the line I—I in FIG. 1A. As shown, the conventional light detecting device comprises a first conduction-type semiconductor substrate 1 with a first electrode 8 formed on the underside; a first conduction-type semiconductor crystal layer 2 including a light absorbing layer; and a second conduction-type first region 3 formed in the first conduction-type semiconductor crystal layer 2 by selectively diffusing a dopant. Thus formed is a pin photodiode structure. pin photodiode structure includes an n-layer (or a p-layer) provided by the semiconductor substrate 1, a p-layer (or an n-layer) provided by a first region 3, and light detecting region 10 provided by the pn junction (the depletion layer or the i layer). A second electrode 5 is provided on the first region 3 in the semiconductor crystal layer 2. The top of the first region 3 inside the electrode 5 is covered with a reflection preventive film 6, and the top of semiconductor crystal layer 2 outside the electrode 5 is covered with a device protective film 9.

In the semiconductor device of the above-described structure, when an reverse bias is applied, an electric field is generated in the depletion layer. Electrons and holes generated by incident light on a light detecting region 10 are divided respectively to the first conduction-type semiconductor substrate 1 and to the second conduction-type region 3 and are accelerated. Thus a photocurrent can be taken outside, and an optical signal can be detected.

In the above-described structure of FIG. 1A and 1B, when light is incident on the light detecting region 10, photo-carriers are generated in the depletion layer, and a good response characteristic can be obtained. But when light is incident outside the light detecting region 10, due to density gradient the generated carriers are diffused to reach the depletion layer, and are taken out in a photocurrent. The transfer of the diffused carriers is slow. When the carriers reach the light detecting region 10, adversely a tail is generated at the last transition of a light-pulse-responding waveform.

In the application of the above-described light detecting device to the optical communication, light exiting an optical fiber is focused so as to enter the light detecting region 10. In a case that a part of the light leaks outside the light detecting region 10, it leads to a lowered response speed of the light detecting device for the above-described reason. Especially in a light detecting device of high response speed, since an area of the light detecting region 10 is made small to decrease a junction capacitance, light is incident by a higher ratio on the outside of the light detecting region 10, adversely a diffused carrier component resulting in a lowered response speed is increased, which leads to a decrease in a response speed of the device.

In the case that, to keep a light output of a semiconductor laser constant, a drive current of the semiconductor laser is feedback-controlled on the basis of light emitted from the rear end surface of the semiconductor laser, if light emitted by the semiconductor laser adversely spreads even outside the light detecting region 10 of the light detecting device, the diffused carriers, as described above, a carrier component which delays a response speed, which affects the feedback control.

SUMMARY OF THE INVENTION

A first object of this invention is to provide a light detecting device which has successfully solved the above-described problems and improved electric characteristics, such as response speed, etc., and optical characteristics.

A second object of this invention is to provide a light detecting device comprising a first region formed of second conduction-type semiconductor and formed in a first conduction-type semiconductor layer, a second region formed of second conduction-type semiconductor and spaced from the first region and surrounding the first region, and a conductor layer provided both on at least one part of top surface of the semiconductor layer and on at least one part of top surface of the second region.

According to the above-described light detecting device of this invention, even if incident light leaks outside the light detecting region which is the pn junction formed between the first conduction-type semiconductor layer and the first region and adversely generates carriers, the carriers are absorbed by the second region with the result that the flow of the diffused carriers into the light detecting region can be prevented. Consequently a necessary photoelectric current alone can be taken out to an outside circuit. Decrease of a response speed of the device can be prevented.

The first conduction-type semiconductor layer and the second region is short-circuited by a conductor layer of a metal, a semiconductor or others formed over their top surfaces, and carriers absorbed by the second region can be recombined or extinguished. Accordingly carriers are not accumulated in the second region. Even when light pulse of very high intensities is incident, no tail is generated at the last transition of a response waveform for the light pulse. Thus, electric and optical characteristics of the device can be improved.

A third object of this invention is to provide a light detecting device in which the second region has a ring-shape, and the conductor layer is provided on a surface area including a boundary between the second region and the first conduction-type semiconductor layer outside of the second region.

A fourth object of this invention is to provide a light detecting device in which the conductor layer is provided on a surface area including a boundary between the second region and the first conduction-type semiconductor layer between the first and the second regions.

A fifth object of this invention is to provide a light detecting device in which a first output electrode is connected to the top surface of the first region, and a second output electrode is connected to the underside of the substrate on the underside of the first conduction-type semiconductor layer. The first output electrode and the second output electrodes outputs photoelectric currents respectively corresponding to carriers of the second conduction type and to carriers of the first conduction type.

A sixth object of this invention is to provide a light detecting device in which a first output electrode is connected to the top surface of the first electrode, and a second output electrode is provided by the conductor layer.

A seventh object of this invention is to provide a light detecting device in which the first conduction-type semiconductor layer includes a buffer layer formed on the substrate, a light absorbing layer formed on the buffer layer, and a window layer formed on the light absorbing layer, the second region being extended from the window layer into the light absorbing layer.

A eighth object of this invention is to provide a light detecting device in which the conductor layer does not completely cover the boundary between the surface of the first conduction-type semiconductor layer and the surface of the second region, but partially covers the same.

DESCRIPTION OF THE PREFERRED EMBODIMENTS

Figure 1A:
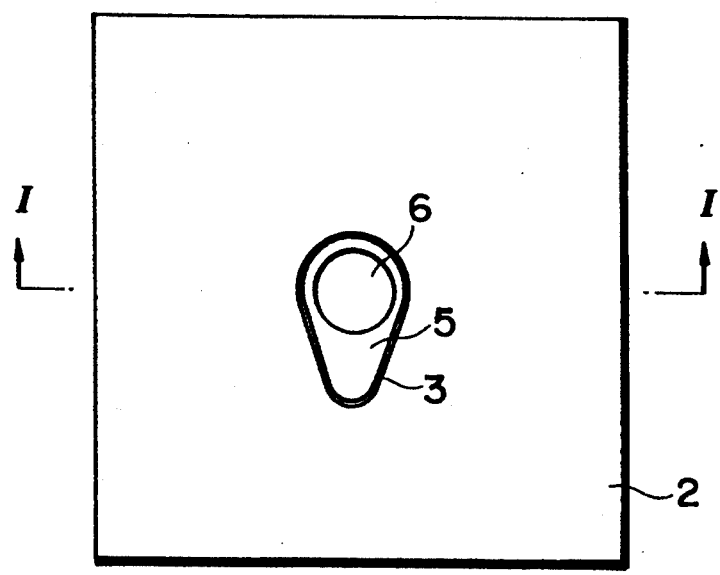
FIGS. 1A and 1B are view of a structure of a conventional light detecting device.
Figure 1B:
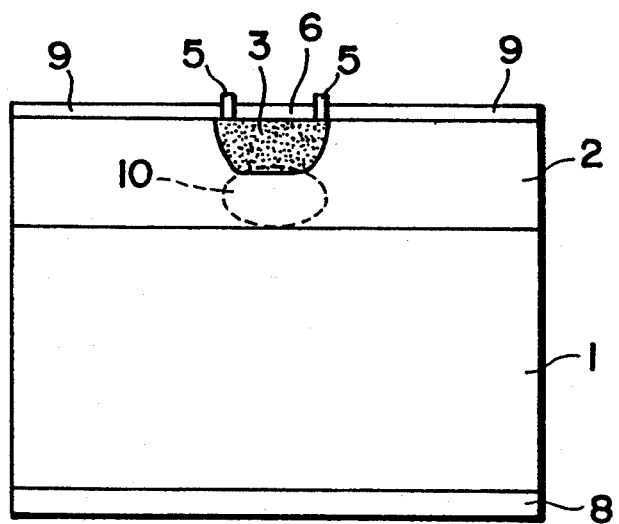
Figure 2A:
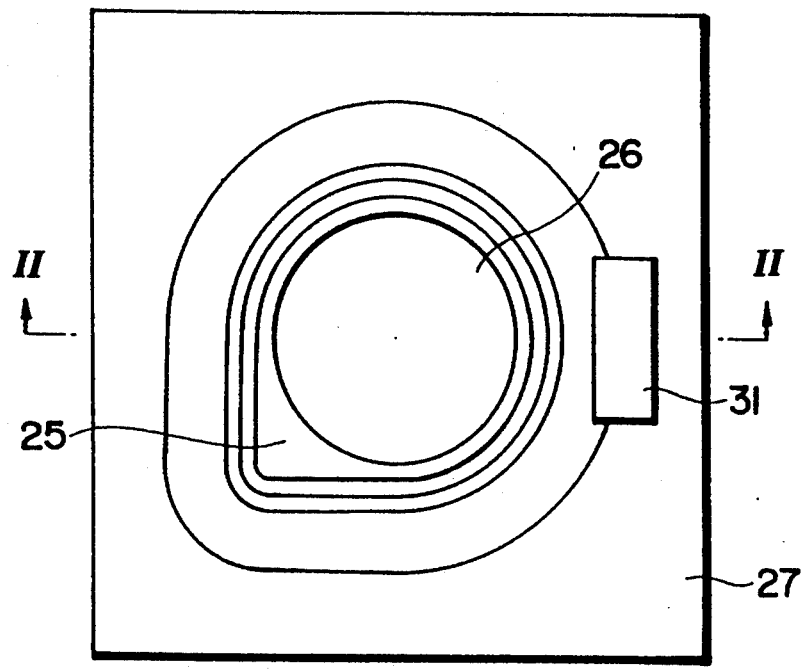
FIGS. 2A and 2B are views of the light detecting device according to a first embodiment of this invention.
Figure 2B:
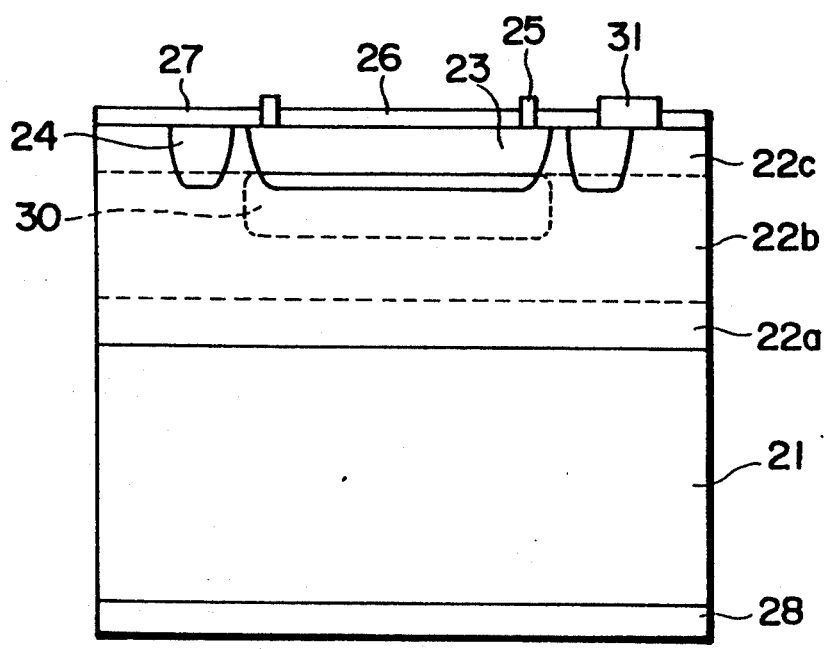

A first embodiment of this invention will be explained with preference to FIG. 2. FIG. 2A is a top view of the light detecting device according to the first embodiment, and FIG. 2B is a sectional view along the line I—I. On an n+ InP (Indium-Phosphide) semiconductor substrate 21 with an n-electrode 28 formed on the underside, there are formed a non-doped InP buffer layer 22a (carrier concentration: $n=2\times 10^{15}$ cm$^{-3}$, thickness: 2 μm), a non-doped InGaAs (Indium-Gallium-Arsenide) light-detecting layer 22b ($n=3\times 10^{15}$ cm$^{-3}$, thickness: 3.5 μm), and a non-doped InP window layer 22c ($n=1\times 10^{15}$ cm$^{-3}$, thickness: 2 μm) for decreasing a dark current. In the light detecting layer 22b and the window layer 22c, there are formed a p-type first region 23 and a p-type second region 24 by selectively diffusing Zn. The first region has a 200 μm-diameter, and the second region 24 (charge trapping region) has a 40 μm-width. The n-type region between the first region 23 and the second region 24 around the first region 23 has a 10 μm-width. A p-electrode 25 is formed on the first region 23, and a reflection reducing film or antireflection film 26 is formed on that part of the region 23 inside the electrode 25, and a device protecting film or passivation film 27 is formed on that part of the first region 23 outside the electrode 25 and the window layer 22c including the second region 24.

In this structure, electrons and holes generated by incident light on the light detecting region 30 are divided respectively toward the semiconductor substrate 21 and the first region 23, and are accelerated. Consequently an optical signal can be detected. If light incident on parts other than the light detecting region 30, generates unnecessary carriers, they are captured by a built-in potential formed in the second region 24 embedded in the semiconductor crystal layers between 22b and 22c and are hindered from entering the light detecting region 30. Eventually a photocurrent necessary for detecting an optical signal can be taken out.

But a part of the carriers absorbed and trapped by the second region 24 are recombined and extinguished in the semiconductor crystal layer, but the others are accumulated in the second region 24. Especially when a light pulse of high intensity is input, a ratio of carriers extinguished by recombination is low, and most remaining carriers are accumulated in the second region 24. Resultantly a built-in potential formed in the second region becomes weak, and a ratio of carriers trapped by the second region is lowered. Diffused carriers having a lower transfer speed flow into the light detecting region 30, and a tail is generated at the last transition of a response waveform for the light pulse. Thus, electric and optical characteristics of the device are affected.

The above-described affect is more remarkable especially in the case that the second region 24 is not exposed at the end surface of the second region 24. In this case, recombinations and extinctions of the carriers hardly take place, and carriers are accordingly accumulated in the second region 24. In this state, as described above, electric and optical characteristics are affected. In the case that the second region 24 is exposed at an end surface of the device, carriers tend to leak at the end surface and to be recombined. Consequently most carriers are not accumulated in the second region 24, and accordingly a built-in potential in the second region 24 does not tend to be lowered. Consequently a ratio of carriers trapped by the second region 24 does not lower with the result that electric and optical characteristics are not seriously affected. However, in applying the light detecting device according to this embodiment to various optical devices, it is necessary to extinguish generated carriers more quickly to maintain a state in which no carriers are accumulated in the second region 24 even when light of high intensity is input.

Here to eliminate the above-described influence, in addition to the above-described structure, as shown in FIG. 2, a metal film 31 is formed on the semiconductor crystal layers 22a, 22b, 22c so as to be in contact both with the p-type second region 24 and with the n-type region outside the second region 24. This metal film 31 is formed by alloying Au/Zn/Au and is contact over a 10 μm-width both with the second region 24 and with the n-type region outside the second region 24. The area of the metal film 31 is 20 μm×40 μm.

It is preferable that the light detecting layer 22b has a thickness of 2~7 μm for good absorbing efficiency of incident light, but the width is not necessarily limited to this range. The n-type region between the p-type first region 23 and the p-type second region 24 preferably has a width of 2~40 μm, but the width is not necessarily limited to the range. The shape and width of the metal film 31 in contact with the n-type region and with the p-type second region 24 are not necessarily limited to the above.

In the above-described structure, when light is incident on regions other than the light detecting region 30, unnecessary generated carriers are captured by the second region 24 which is a charge trapping region.

Consequently no tail is generated at the last transition or the fall of a light pulse, and only a photocurrent necessary for the detection of an optical signal can be taken out. The captured carriers are recombined and extinguished by the metal film 31 short-circuiting the window layer 22c and the second region 24 and are not accumulated in the second region 24. Accordingly a ratio of carriers captured by the second region 24 does not lowered, and electric characteristics and optical characteristics are not affected. In terms of the structure, it is not necessary to provide an extra electrode and connect the same to the electrode 28 in order to take out accumulated carriers. The device can have a simplified structure. The diameter of the region 23, etc. is not limited to this embodiment.

Figure 3A:
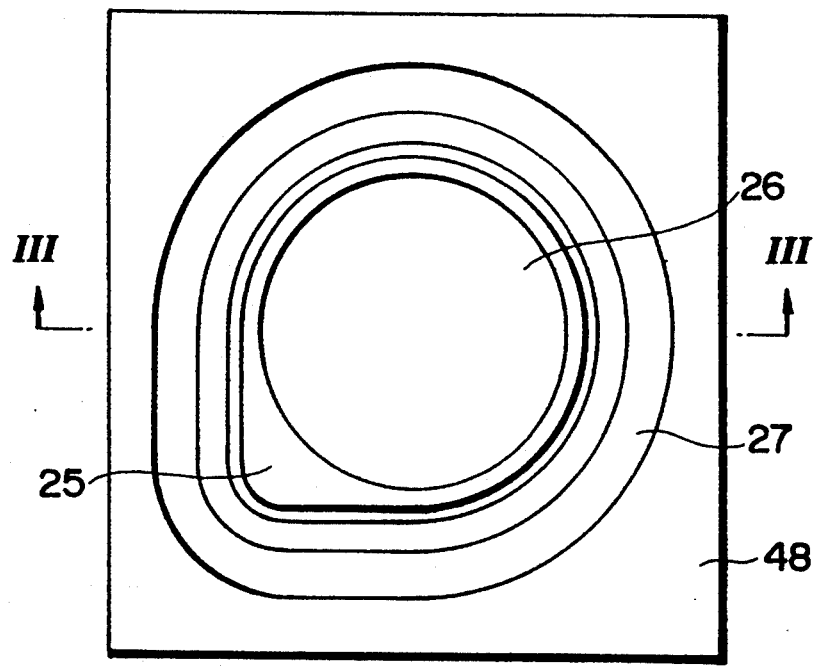
FIG. 3A and 3B are views of the light detecting device according to a second embodiment of this invention.
Figure 3B:
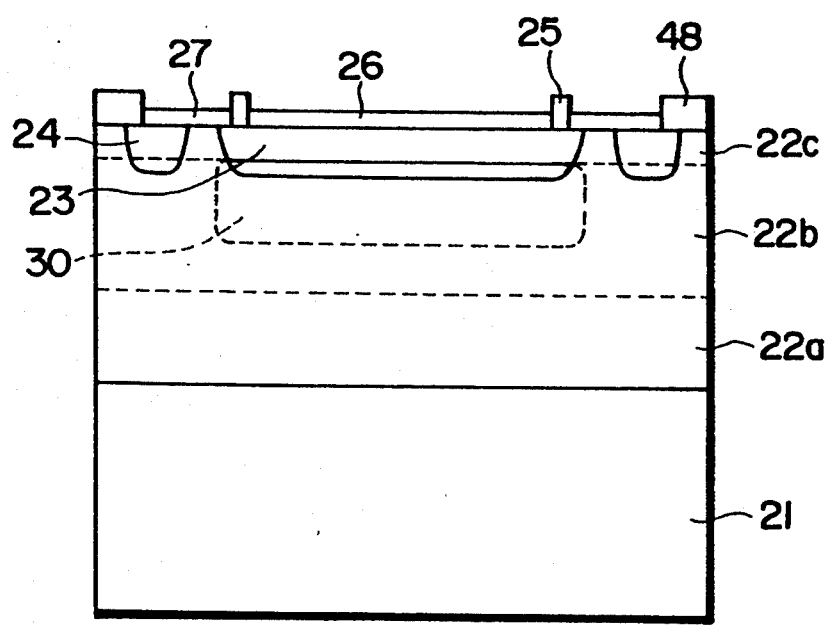

The light detecting device according to a second embodiment of this invention will be explained with reference to FIG. 3. FIG. 3A is a top view of the light detecting device according to this embodiment, and FIG. 25 3B is a sectional view along the line III—III. On a Fe doped InP substrate 21 (specific resistance: $\rho = 1 M\Omega\cdot cm$), there are formed a non-doped InP buffer layer 22a ($n=1\times10^{15}$ cm$^{-3}$, thickness: 1 $\mu m$) a non-doped InGaAs light detecting layer 22b ($n=1\times10^{15}$ cm$^{-3}$, thickness: 4 $\mu m$) and a non-doped window layer 22c ($n=2\times10^{15}$ cm$^{-3}$, thickness: 3 $\mu m$). In the light detecting layer 22b and the window layer 22c there are formed a p-type first region 23 and a p-type second region 24 by selectively diffusing Zn by ampul or sealed tube method. The first region has a 300 $\mu m$-diameter. Because of this region 23, a structure including the pn junction as the light detecting region 30 can be provided. The n-type region between the first region 23 and the second region 24 has a 20 $\mu m$-width. On the first region 23 there is provided a p-electrode 25. An antireflection film 26 is provided on that part of the region 23 inside the electrode 25, and a device protecting film 27 is formed on that part of the region 23 outside the electrode 25 and on the second region 24 in the window layer 22c. An n-electrode 48 for the light detecting device is formed on that part of the InP window layer 22c outside the second region 24 and on a part of the second region 24. the n-electrode 48 has a 330 $\mu m$-inner diameter and is over the second region 24 by 5 $\mu m$.

In the above-described structure, the electrode 48 formed in contact with both the p-type second region 24 and the n-type window layer 22c can function as the n-electrode electrode 28 (FIG. 2) for taking out a photoelectric current, and as the metal film 31 (FIG. 2) for recombining carriers captured by the second region (charge trapping region) 24. The second embodiment has a simple structure but can produce the same advantageous effect as the first embodiment.

Figure 4A:
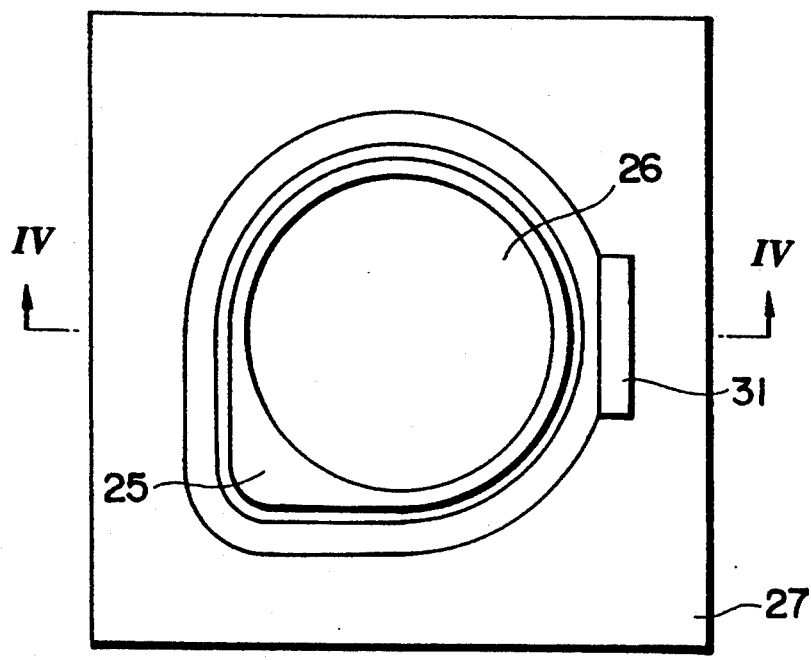
FIGS. 4A and 4B are views of the light detecting device according to a third embodiment of this invention.
Figure 4B:
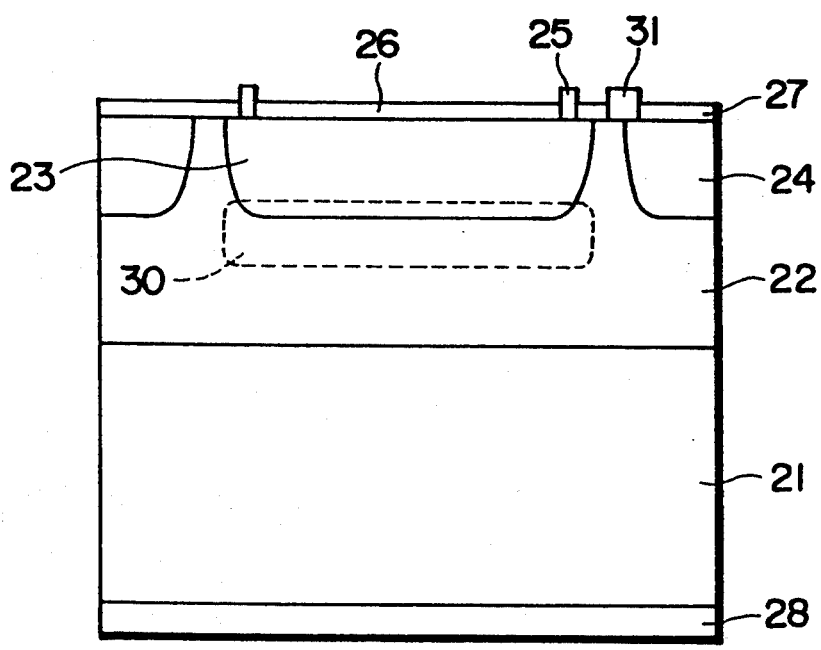

The light detecting device according to a third embodiment of this invention will be explained with reference to FIG. 4. FIG. 4A is a top view of the light detecting device according to the third embodiment of this invention, and FIGS. 4B is a sectional view along the line IV—IV. As shown, on the surface of an n-type (first conduction-type) semiconductor substrate 21 with an n-electrode 28 formed on the underside, there is formed an n-type semiconductor crystal layer 22. A p-type (second conduction-type) first region 23 is formed on the semiconductor crystal layer 22 by diffusing a dopant by ampul method. The first region 23 has a 300 $\mu m$-diameter. The first region 23 forms a pn junction which is a light detecting region 30. This first region 23 is surrounded by a p-type second region 24 which is formed as a charge trapping region by diffusing a dopant. The second region 24 is spaced from the first region 23 by 20 $\mu m$. A p-type (second conduction-type) electrode 25 is provided on the first region 23. An antireflection film 26 is formed on that part of the first region 23 inside the electrode 25, and a device protecting film 27 is formed on that part of the first region 23 outside the electrode 25 and on the semiconductor crystal layer 22 including the second region 24. A metal film 31 is provided in contact with the semiconductor crystal layer 22 and with the second region 24. In this embodiment, the metal film 31 contacts over a 5 $\mu m$-width respectively with the semiconductor crystal layer 22 and with the second region 24 so that carriers captured by the second region can be recombined and annihilated. The metal film 31 has an area of 10 $\mu m \times 50$ $\mu m$.

In this structure as well as that according to the first embodiment, unnecessary carriers are collected in the second region further to be recombined and extinguished by the metal film 31. Accordingly diffused carriers never affect electric characteristics of the device, such as response speed etc., and optical characteristics thereof. But a disadvantage of this embodiment is that because of the location of the metal film 31, whose reflectance is high, near the first region 23, in comparison with the first embodiment light tends to leak to the surroundings.

The semiconductor materials and their dimensions referred to above are merely exemplified and can be varied in accordance with applications, wavelengths to be used, etc. For example, the materials of the semiconductors may be compound semiconductors, such as GaAs (Gallium-Arsenide), InGaAsP (Indium-Gallium-Arsenide-Phosphide), AlGaAs (Aluminium-GalliumArsenide), CdTe (Cadmium-Telaride), HgCdTe (Mercury-Cadmium-Telaride), InSb (Indium-Antimonide). etc., or Si (Silicon), Ge (Germanium), etc. In the case that AlGaAs is used for the light absorbing layer, GaAs or others, for example, can be used for the window layer. As dopants, Be (Beryllium), Cd (Cadmium), etc. may be used. The dopants may be added by ion implantation or others. The second region and the semiconductor crystal layer is not necessarily short-circuited by a metal film, but may be short-circuited by a semiconductor layer. The metal film may be formed e.g., by vacuum evaporating an AuGeNi alloy or by depositing Au/Ge/Ni on the semiconductor crystal layer and alloying the same. The semiconductor layer may be provided by, e.g., amorphous silicon.

We claim:

1. A semiconductor light detection device comprising:
    a semiconductor layer of a first conduction-type semiconductor;
    a first region formed of a second conduction-type semiconductor and embedded in said semiconductor layer;
    a second region formed of said second conduction-type semiconductor and embedded so as to be spaced from said first region and so as to surround said first region; and
    a conductor layer provided both on at least one part of a top surface of said semiconductor layer and on at least one part of a top surface of said second region.

2. The light detection device according to claim 1, wherein the conductor layer is a metal film.

3. The light detection device according to claim 1, wherein the conductor layer is a conductive semiconductor layer.

4. The light detection device according to claim 1, wherein the second region has an annular shape, and the conductor layer is provided on a surface area including a boundary between the second region and a part of the first conduction-type semiconductor layer outside the second region.

5. The light detection device according to claim 1, wherein the conductor layer is provided on a surface area including a boundary between the second region and a part of the first conduction-type semiconductor layer between the first and the second regions.

6. The light detection device according to claim 1, wherein a first output electrode is connected to the top surface of the first region, and a second output electrode is connected to an underside of a substrate provided on the underside of an first conduction-type semiconductor layer.

7. The light detection device according to claim 4, wherein a first output electrode is connected to the top surface of the first region, and a second output electrode is provided by the conductor layer.

8. The light detection device according to claim 1, wherein the first conduction-type semiconductor layer comprises a buffer layer formed on a substrate, a light absorbing layer formed on the buffer layer, and a window layer formed on the light absorbing layer; and the second region extend from the window layer to the light absorbing layer.

9. The light detection device according to claim 1, wherein the conductor layer partially covers the boundary between the surface of the-first conductive-type semiconductor layer and the surface of the second region.

10. The light detection device according to claim 2, wherein the metal film is formed of an AuZn alloy.

11. The light detection device according to claim 2, wherein the metal film is formed of an AuGeNi alloy.

12. The light detection device according to claim 3, wherein the conductive semiconductor layer is formed of amorphous Si.

13. The light detection device according to claim 1, wherein the first conduction-type semiconductor layer is formed of InGaAs.

14. The light detection device according to claim 1, wherein the first conduction-type semiconductor layer is formed of GaAs.

15. The light detection device according to claim 1, wherein the first conduction-type semiconductor layer is formed of InGaAsP.

16. The light detection device according to claim 1, wherein the first conduction-type semiconductor layer is formed of AlGaAs.

17. The light detection device according to claim 1, wherein the first conduction-type semiconductor layer is formed of CdTe.

18. The light detection device according to claim 1, wherein the first conduction-type semiconductor layer is formed of HgCdTe.

19. The light detection device according to claim 1, wherein the first conduction-type semiconductor layer is formed of InSb.

20. The light detection device according to claim 1, wherein the first conduction-type semiconductor layer is formed of Si.

21. The light detection device according to claim 1, wherein the first conduction-type semiconductor layer is formed of Ge.

22. The light detection device according to claim 1, wherein the first and the second regions are formed by the diffusion of Zn.

23. The light detection device according to claim 1, wherein the first and the second regions are formed by the diffusion of Be.

24. The light detection device according to claim 1, wherein the first and the second regions are formed by the diffusion of Cd.

25. The light detection device according to claim 5, wherein a first output electrode is connected to the top surface of the first region, and a second output electrode is provided by the conductor layer.

26. The light detection device according to claim 2, wherein the metal film is formed of a TiAu.

27. The light detection device according to claim 1, wherein the first conduction-type semiconductor layer is formed of InP.

28. The light detecting device according to claim 1, wherein
said second region is provided within and surrounded by a second portion of said semiconductor layer; and
said conductor layer is provided partially on a surface of both said second portion of said semiconductor layer and said second region.

* * * * *